US011114327B2

(12) United States Patent
Boyd, Jr. et al.

(10) Patent No.: US 11,114,327 B2
(45) Date of Patent: Sep. 7, 2021

(54) ESC SUBSTRATE SUPPORT WITH CHUCKING FORCE CONTROL

(71) Applicant: Applied Materials, Inc., Santa Clara, CA (US)

(72) Inventors: Wendell Glenn Boyd, Jr., Morgan Hill, CA (US); Jim Zhongyi He, San Jose, CA (US); Zhenwen Ding, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 16/105,731

(22) Filed: Aug. 20, 2018

(65) Prior Publication Data

US 2019/0067070 A1 Feb. 28, 2019

Related U.S. Application Data

(60) Provisional application No. 62/551,747, filed on Aug. 29, 2017.

(51) Int. Cl.
*H01L 21/683* (2006.01)
*H01L 21/67* (2006.01)
(Continued)

(52) U.S. Cl.
CPC .......... *H01L 21/6833* (2013.01); *H01J 37/32* (2013.01); *H01J 37/32724* (2013.01);
(Continued)

(58) Field of Classification Search
CPC .......... H01J 37/32724; H01J 37/32935; H01J 37/32; H01J 2237/24507; H01L 21/67017;
(Continued)

(56) References Cited

U.S. PATENT DOCUMENTS 5,094,536 A 3/1992 MacDonald et al.
5,325,261 A 6/1994 Horwitz
(Continued)

FOREIGN PATENT DOCUMENTS

JP H05129421 A 5/1993
JP H06163674 A 6/1994
(Continued)

OTHER PUBLICATIONS

"Displacement Measurement by Fiber Optics" https://mtiinstruments.com/applications/fiber-optic-displacement-measurement/ (Year: 2021).*
(Continued)

*Primary Examiner* — Yuechuan Yu
(74) *Attorney, Agent, or Firm* — Patterson + Sheridan, LLP

(57) ABSTRACT

Embodiments described herein provide methods and apparatus used to reduce or substantially eliminate undesirable scratches to the non-active surface of a substrate by monitoring and controlling the deflection of a substrate, and thus the contact force between the substrate and a substrate support, during substrate processing. In one embodiment a method for processing a substrate includes positioning the substrate on a patterned surface of a substrate support, where the substrate support is disposed in a processing volume of a processing chamber, applying a chucking voltage to a chucking electrode disposed in the substrate support; flowing a gas into a backside volume disposed between the substrate and the substrate support, monitoring a deflection of the substrate, and changing a chucking parameter based on the deflection of the substrate.

20 Claims, 6 Drawing Sheets

(51) Int. Cl.
  *H01J 37/32*     (2006.01)
  *H01L 21/66*     (2006.01)
  *C23C 14/50*     (2006.01)

(52) U.S. Cl.
  CPC .. *H01J 37/32935* (2013.01); *H01L 21/67017* (2013.01); *H01L 21/67109* (2013.01); *H01L 21/67253* (2013.01); *H01L 21/67288* (2013.01); *H01L 22/26* (2013.01); *C23C 14/50* (2013.01); *H01J 2237/24507* (2013.01); *H01L 22/12* (2013.01)

(58) Field of Classification Search
  CPC ................ H01L 21/6833; H01L 22/26; H01L 21/67253; H01L 21/67288; H01L 21/67109; H01L 22/12; C23C 14/50
  See application file for complete search history.

(56) References Cited

U.S. PATENT DOCUMENTS

| | | | |
|---|---|---|---|
| 5,491,603 | A | 2/1996 | Birang et al. |
| 5,677,824 | A | 10/1997 | Harashima et al. |
| 5,684,669 | A | 11/1997 | Collins et al. |
| 5,872,694 | A | 2/1999 | Hoinkis et al. |
| 5,956,837 | A | 9/1999 | Shiota et al. |
| 6,075,375 | A | 6/2000 | Burkhart et al. |
| 6,215,640 | B1 | 4/2001 | Hausmann |
| 6,307,728 | B1 | 10/2001 | Leeser |
| 6,395,150 | B1 | 5/2002 | Van Cleemput et al. |
| 6,413,321 | B1 | 7/2002 | Kim et al. |
| 6,430,022 | B2 | 8/2002 | Leeser |
| 6,432,208 | B1 | 8/2002 | Kawakami et al. |
| 6,646,857 | B2 | 11/2003 | Anderson et al. |
| 6,898,064 | B1 | 5/2005 | Berman et al. |
| 6,938,505 | B2 | 9/2005 | Chen et al. |
| 6,950,193 | B1 | 9/2005 | Discenzo |
| 7,292,428 | B2 | 11/2007 | Hanawa et al. |
| 7,663,860 | B2 | 2/2010 | Nishimoto et al. |
| 9,558,981 | B2 | 1/2017 | Boyd, Jr. et al. |
| 10,879,046 | B2 | 12/2020 | Boyd, Jr. et al. |
| 2001/0055189 | A1 | 12/2001 | Hagi |
| 2002/0186934 | A1 | 12/2002 | Hug |
| 2003/0013260 | A1 | 1/2003 | Gossmann et al. |
| 2003/0038112 | A1* | 2/2003 | Liu .................. H01J 37/32935 216/60 |
| 2003/0085205 | A1 | 5/2003 | Lai et al. |
| 2004/0031338 | A1 | 2/2004 | Chen et al. |
| 2005/0207088 | A1 | 9/2005 | Nishimoto et al. |
| 2006/0017934 | A1 | 1/2006 | Van Brocklin et al. |
| 2007/0292071 | A1 | 12/2007 | Zerwekh et al. |
| 2009/0034581 | A1 | 2/2009 | Carcasi |
| 2010/0206482 | A1* | 8/2010 | Matsudo ............... G01J 5/0806 156/345.27 |
| 2011/0235675 | A1 | 9/2011 | Matsudo |
| 2012/0070996 | A1 | 3/2012 | Hao |
| 2013/0088808 | A1* | 4/2013 | Parkhe ................ H01L 21/6833 361/234 |
| 2013/0341496 | A1 | 12/2013 | Bina et al. |
| 2015/0138687 | A1 | 5/2015 | Boyd, Jr. et al. |
| 2017/0076915 | A1 | 3/2017 | Boyd, Jr. et al. |
| 2018/0122681 | A1 | 5/2018 | Ellis et al. |
| 2018/0144959 | A1 | 5/2018 | Nemani et al. |

FOREIGN PATENT DOCUMENTS

| | | |
|---|---|---|
| JP | 2010-147502 A | 7/2010 |
| JP | 2011243834 A | 12/2011 |
| KR | 20040000104 A | 1/2004 |
| KR | 20080048676 A | 6/2008 |
| KR | 10-2010-0015515 A | 2/2010 |
| WO | 2008112673 A2 | 9/2008 |

OTHER PUBLICATIONS

PCT International Search Report and Written Opinion dated Dec. 4, 2018, for International Application No. PCT/US2018/047447.
Tambosso Article from IEEE Photonics Technology Letters, vol. 26, No. 21, Nov. 1, 2014.
U.S. Appl. No. 15/811,352, filed Nov. 13, 2017.
Japanese Office Action for Application No. 2019-563804 dated Jan. 12, 2021.
Korean Office Action for Application No. 10-2020-7001061 dated Feb. 25, 2021.

* cited by examiner

ESC SUBSTRATE SUPPORT WITH CHUCKING FORCE CONTROL

CROSS-REFERENCE TO RELATED APPLICATIONS

This application claims benefit of U.S. Provisional Application Ser. No. 62/551,747, filed on Aug. 29, 2017, which is herein incorporated by reference in its entirety.

BACKGROUND

Field

Embodiments described herein generally relate to semiconductor device manufacturing, and in particular, to methods and apparatus used to control a contact force between an electrostatic chucking (ESC) substrate support and a substrate disposed thereon.

Description of the Related Art

Electrostatic chucking (ESC) substrate supports, commonly known as electrostatic chucks, are used in semiconductor device manufacturing to securely hold a substrate in a processing position within a processing volume of a processing chamber, by means of an electrostatic chucking (ESC) force. The chucking force is a function of the potential between a DC voltage provided to a chucking electrode embedded in a dielectric material of the substrate support and a substrate disposed on a surface of the dielectric material.

A low pressure atmosphere present in a processing volume of a processing chamber results in poor thermal conduction between the dielectric material of the substrate support and the substrate. The poor thermal conduction reduces the substrate support's effectiveness in heating or cooling the substrate to maintain the substrate at a desired temperature or within a desired range of temperatures. Therefore, in some processes, a thermally conductive inert gas, e.g., helium, is introduced into a backside volume disposed between a non-active surface of the substrate and the substrate support to improve heat transfer therebetween. The higher pressure of the backside volume (backside pressure), when compared to the pressure in the processing volume (processing pressure), exerts a backside force on the substrate that is opposite of the chucking force exerted by the chucking electrode. The difference between the chucking force and the backside force comprises a contact force between the substrate and the substrate support surface.

Unfortunately, excessive contact force between the substrate and the substrate support surface results in undesirable scratches on, or pitting of, the non-active surface of the substrate, undesirable wear of the dielectric material of the substrate support, or both. Particulate materials produced from the scratches or from the worn dielectric material of the substrate support eventually transfer from the substrate support or the non-active surface of the substrate to an active surface of the substrate or to other substrates. This particulate transfer, which can occur in the chamber or in subsequent handling and processing operations, ultimately suppresses device yield from the substrates having the particulates transferred thereto.

Accordingly, there is a need in the art for improved methods and apparatus used to control the contact force between an electrostatic chucking (ESC) substrate support and a substrate disposed thereon.

SUMMARY

Embodiments described herein relate to methods and apparatus used to monitor and control the contact force between a substrate and the elevated surfaces of a substrate support in direct contact therewith.

In one embodiment a method for processing a substrate includes positioning the substrate on a patterned surface of a substrate support, where the substrate support is disposed in a processing volume of a processing chamber, applying a chucking voltage to a chucking electrode disposed in the substrate support; flowing a gas into a backside volume disposed between the substrate and the substrate support, monitoring a deflection of the substrate, and changing a chucking parameter based on the deflection of the substrate.

In another embodiment a computer readable medium has instructions stored thereon for a method for processing a substrate. The method includes positioning the substrate on a patterned surface of a substrate support, where the substrate support is disposed in a processing volume of a processing chamber, applying a chucking voltage to a chucking electrode disposed in the substrate support; flowing a gas into a backside volume disposed between the substrate and the substrate support, monitoring a deflection of the substrate, and changing a chucking parameter based on the deflection of the substrate.

In another embodiment, an apparatus for processing a substrate features a substrate support and a sensor at least partially disposed in the substrate support. The substrate support includes a patterned surface having elevated features extending from a recessed surface thereof. A substrate contacting surface area of the elevated features is less than about 30% of a non-device side surface area of a to be processed substrate. The sensor configure to monitor a deflection of a to be processed substrate having a chucking force exerted thereon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features disclosed in one embodiment may be beneficially incorporated in other embodiments without specific recitation thereof.

DETAILED DESCRIPTION

Embodiments described herein relate to methods and apparatus used to monitor and control the contact force between a substrate and the elevated surfaces of a substrate support in direct contact therewith. In particular, embodiments herein use a sensor disposed in the substrate support and methods described herein to desirably control the contact force by monitoring the deflection of a chucked substrate from an unchucked substrate plane thereof.

Typically, a low pressure atmosphere in a processing volume of a plasma processing chamber results in poor thermal conduction between a substrate and the dielectric material of an ESC substrate support upon which the substrate is disposed during processing. To improve heat transfer between the substrate and the ESC substrate support, a thermally conductive inert gas, such as helium, is introduced into a substrate backside volume disposed therebetween. Often, the pressure of the gas in the backside volume will exceed the gas pressure of the processing volume. Thus, the chucking force applied to the substrate by the chucking electrode must exceed the force exerted on the substrate by pressure of the gas in the backside volume to prevent the substrate from moving on the chuck. The difference between the chucking force pulling the substrate towards the substrate support and the backside force (the force exerted on the substrate by the gas pressure in the backside volume) pushing the substrate away from the substrate support yields the contact force between the substrate and the substrate support surfaces in direct contact therewith.

Excessive contact force between the substrate and the substrate support results when the contact force significantly exceeds the minimum contact force required to securely hold the substrate in position for the processing thereof. Excessive contact force between the substrate and the substrate support results in one or both of undesirable scratching or pitting of the non-active surface of a substrate and undesirable wear of the substrate support surfaces of the substrate support. Materials produced from scratching the substrate become loose particles on the non-active surface of the substrate and on the substrate support. The loose particles eventually transfer to the active surface of the substrate or another substrate during handling or subsequent processing. This increased defectivity on the active surface of the substrate negatively impacts the device yield therefrom. Further, undesirable wear of surfaces of the substrate support reduces the useful lifetime of the electrostatic chuck. Therefore, apparatus and methods provided herein facilitate in-situ monitoring and control of the contact force between the substrate support and a substrate disposed thereon.

Figure 1A:
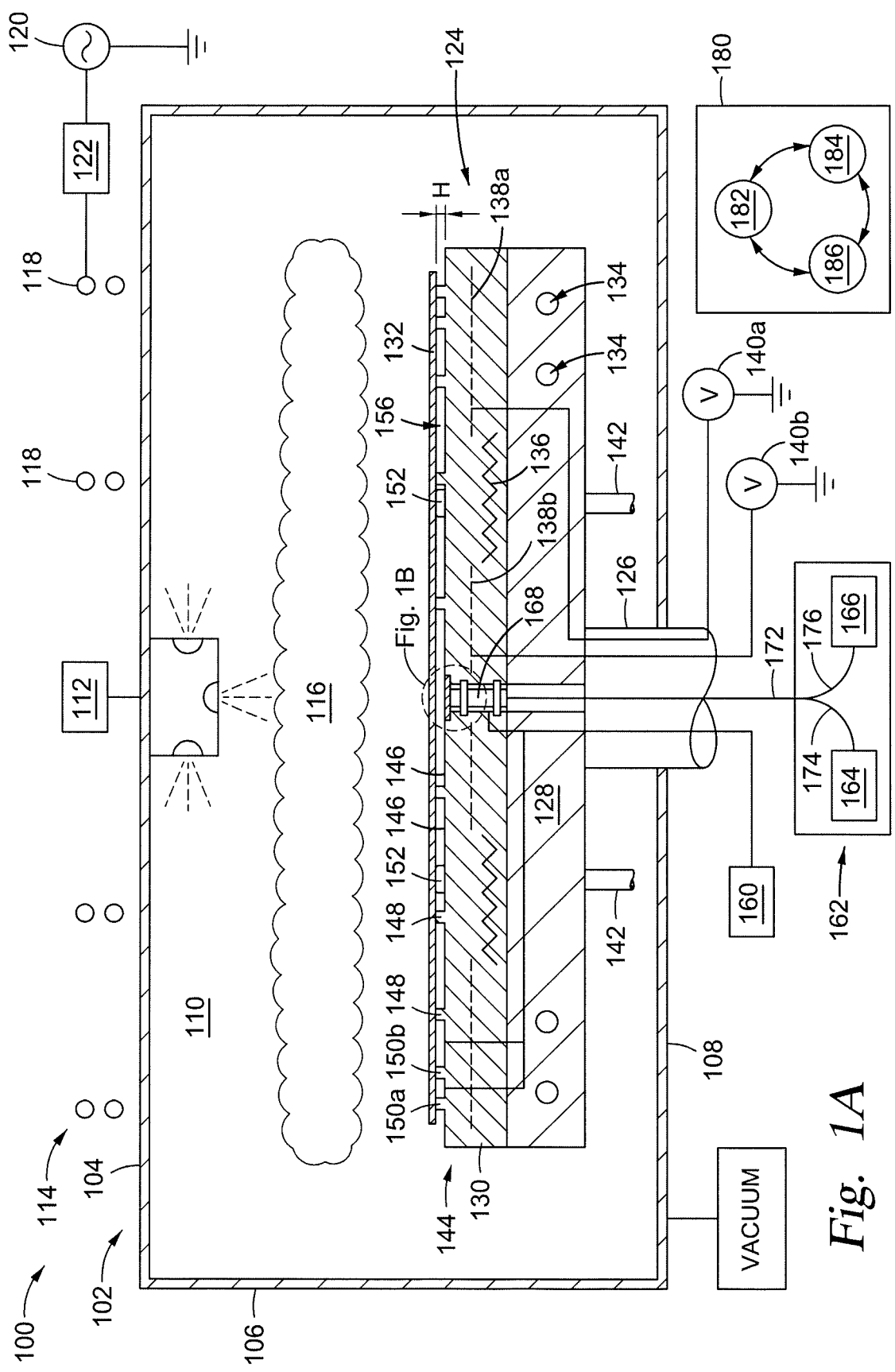
FIG. 1A is a schematic cross-sectional view of a substrate processing chamber configured to practice the methods set forth herein, according to one embodiment.
Figure 1B:
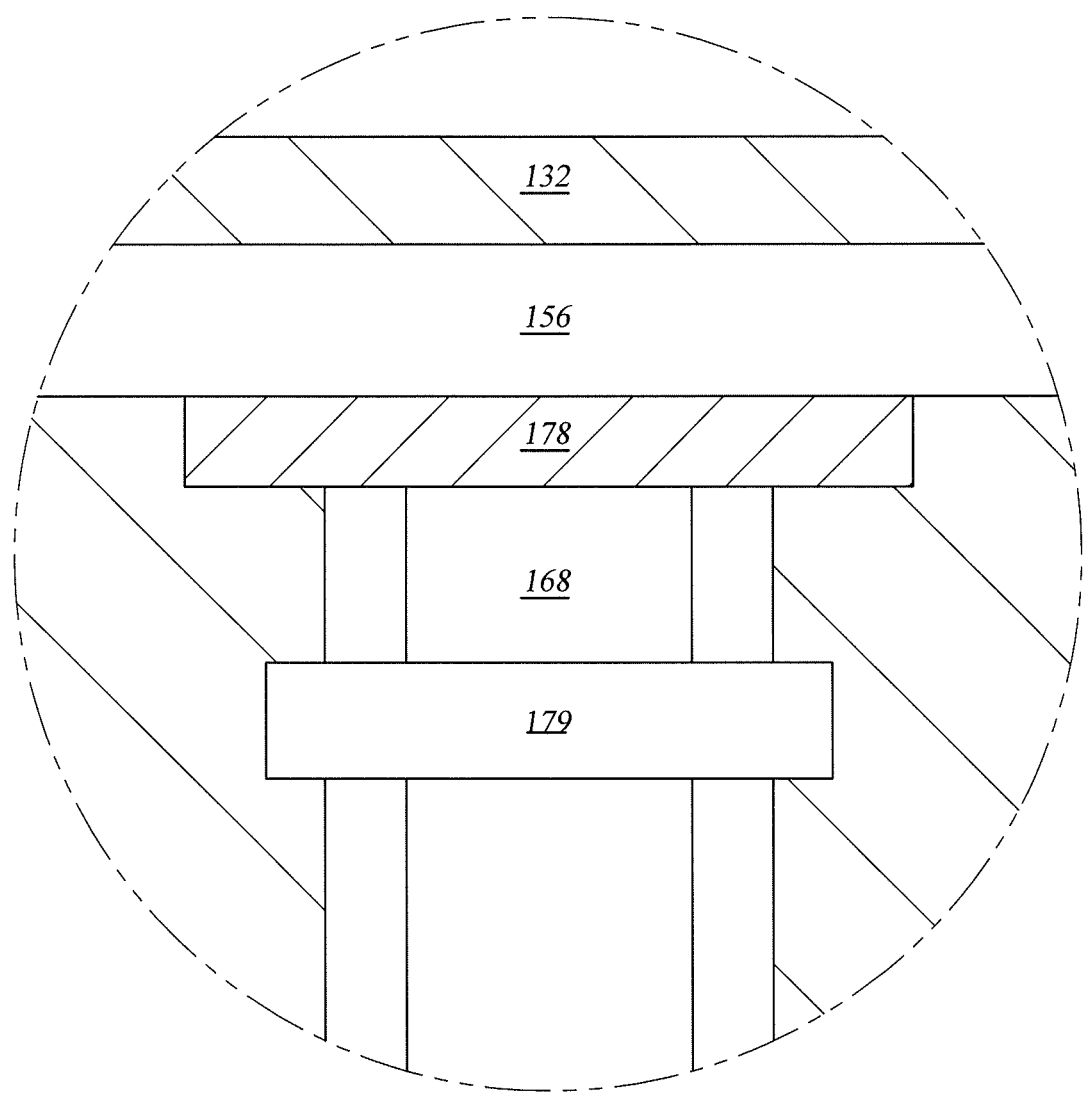
FIG. 1B is an enlarged view of a portion of the substrate support disposed in the processing chamber shown in FIG. 1A.
Figure 1C:
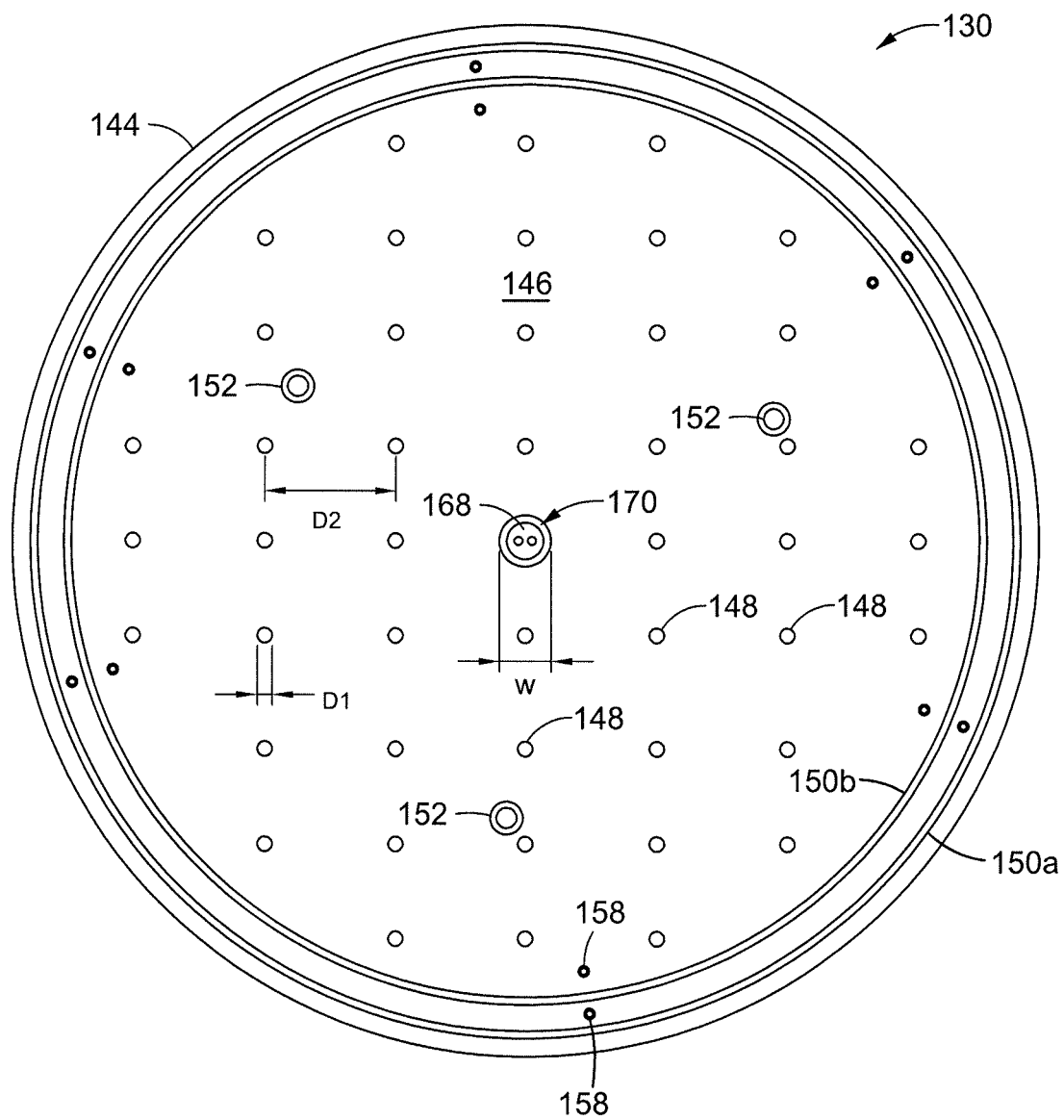
FIG. 1C is a schematic plan view of the substrate support shown in FIG. 1A without a substrate disposed thereon.

FIG. 1A is a schematic cross-sectional view of a plasma processing chamber configured to practice the methods set forth herein, according to one embodiment. FIG. 1B is a close up view of a portion of the substrate support, and the substrate disposed thereon, shown in FIG. 1A. FIG. 1C is a schematic plan view of the substrate support shown in FIG. 1A without a substrate disposed thereon.

In this embodiment, the processing chamber is a plasma etch processing chamber, such as a reactive ion etch (RIE) plasma chamber. In other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In other embodiments, the processing chamber is a plasma treatment chamber, or a plasma based ion implant chamber, for example a plasma doping (PLAD) chamber, or a physical vapor deposition chamber. Herein, the processing chamber includes an inductively coupled plasma (ICP) source electrically coupled to a radio frequency (RF) power supply. In other embodiments, the plasma source is a capacitively coupled plasma (CCP) source, such as a plasma electrode disposed in the processing volume facing the substrate support where the plasma electrode is electrically coupled to an RF power supply.

The processing chamber 100 features a chamber body 102 including a chamber lid 104, one or more sidewalls 106, and a chamber base 108, which collectivity define a processing volume 110. The processing volume 110 is fluidly coupled to a processing gas source 112 which delivers processing gases thereinto. The processing chamber 100 further includes a plasma generator 114 configured to ignite and maintain a plasma 116 from the processing gases. The plasma generator 114 includes one or more inductive coils 118 disposed proximate to the chamber lid 104 outside of the processing volume 110. The one or more inductive coils 118 are electrically coupled to an RF power supply 120 through an RF matching circuit 122. The plasma generator 114 is used to ignite and maintain the plasma 116 using the processing gases and inductive energy generated by the inductive coils 118 powered by the RF power supply 120. Here, the processing volume 110 is fluidly coupled to a vacuum source, such as one or more dedicated vacuum pumps to maintain the processing volume 110 at sub-atmospheric pressure and evacuate processing, and other gases, therefrom.

In embodiments herein, the processing chamber 100 further includes a substrate support assembly 124 disposed in the processing volume 110. The substrate support assembly 124 is disposed on a movable support shaft 126 sealingly extending through the chamber base 108, such as being surrounded by a bellows (not shown) in a region below the chamber base 108 or in a region disposed between the substrate support assembly 124 and the chamber base 108.

The substrate support assembly 124 includes a cooling base 128 and a substrate support 130 thermally coupled to, and disposed on the cooling base 128. The cooling base 128 is used to regulate the temperature of the substrate support 130, and thus the temperature of a substrate 132 disposed on the substrate support 130, during substrate processing. In some embodiments, the cooling base 128 includes one or cooling channels 134 disposed therein which are fluidly coupled to, and in fluid communication with, a coolant source (not shown), such as a refrigerant source or modified water source having a relativity high electrical resistance. Typically, the cooling base 128 is formed of a corrosion resistant thermally conductive material, such as a corrosion resistant metal, for example aluminum, an aluminum alloy, or stainless steel. The substrate support 130 is formed from a dielectric material, such as a bulk sintered ceramic material, such as silicon carbide (SiC) or a metal oxide or metal nitride ceramic material, for example aluminum oxide ($Al_2O_3$), aluminum nitride (AlN), titanium oxide (TiO), titanium nitride (TiN), yttrium oxide ($Y_2O_3$), mixtures thereof, and combinations thereof. The substrate support 130 is thermally coupled to the cooling base with an adhesive or by mechanical means.

In some embodiments, the substrate support 130 includes a heating element 136, embedded in the dielectric material thereof. The heating element 136 is used to heat the substrate support 130, and thus the substrate 132, to a desired temperature before processing and to maintain the substrate 132 at a desired temperature during processing. In some embodiments, the substrate support assembly 124 includes both the heating element 136 and the cooling channels 134 to facilitate fine control of the substrate support temperature.

Herein, the substrate support 130 includes one or more chucking electrodes 138a-b embedded in the dielectric material thereof. The one or more chucking electrodes 138a-b are used to secure the substrate 132 to the substrate support 130 by providing a potential between the substrate 132 and the chucking electrode 138. The potential between the substrate 132 and the one or more chucking electrodes 138a-b results in an electrostatic chucking (ESC) attraction force therebetween. Herein, the one or more chucking electrodes 138a-b are electrically coupled to a respective chucking power supply 140a-b, such as a DC power supply, which provides a chucking voltage thereto between about −5000 V and about +5000.

In some embodiments, the substrate support 130 comprises at least two electrodes, such as a first electrode 138a and a second electrode 138b, embedded in the dielectric material of the substrate support. In those embodiments, the at least two electrodes 138a-b are electrically isolated from one another by the dielectric material of the substrate support 130 disposed therebetween. In some of those embodiments, each of the electrodes is coupled to a corresponding DC power supply 140a-b, where each of the corresponding DC power supplies 140a-b provides a voltage of opposite polarity from the other to the first and second electrode 138a-b respectively coupled thereto.

Typically, the substrate 132 is loaded into the processing volume 110 through an opening (not shown) in one of the one or more sidewalls 106, which is conventionally sealed with a door or a valve (not shown) during substrate processing. A plurality of lift pins 142 are movably disposed through the substrate support assembly 124 to facilitate transferring of the substrate 132 thereto and therefrom. When the plurality of lift pins 142 are in a raised position they extend above a patterned surface 144 of the substrate support 130 lifting the substrate 132 therefrom and enabling access to the substrate 132 by a robot handler (not shown). When the plurality of lift pins 142 are in a lowered position the upper surfaces thereof are flush with, or disposed below, the patterned surface 144 of the substrate support 130 and the substrate 132 rests thereon.

The patterned surface 144 of the substrate support 130 (shown in a schematic plan view in FIG. 1C), includes a plurality of elevated features extending from a recessed surface 146 thereof. The elevated features form the substrate contact surfaces when a substrate is disposed thereon. Herein, the elevated features include a plurality of protrusions 148, one or more sealing bands 150a-b disposed proximate to the circumference of the substrate support 130, and a plurality of sealing lips 152 circumferentially and coaxially disposed about a plurality of respective lift pin openings 154 (shown in FIG. 1C). The plurality of protrusions 148, at least, hold the substrate 132 spaced from the recessed surface 146 when the substrate 132 is chucked to the substrate support 130. The plurality of elevated features, the recessed surface 146, and the non-device side surface of the substrate 132 collectively define the boundary surfaces of a backside volume 156 when the substrate 132 is chucked to the substrate support 130. During substrate processing, a heat transfer gas, herein a thermally conductive inert gas, for example helium or argon, is used to thermally couple the substrate 132 to the substrate support 130 by facilitating heat transfer therebetween. In some embodiments, the heat transfer gas is delivered to the backside volume 156 through a plurality of gas ports 158 (shown in FIG. 1C) formed in the substrate support 130 which are in fluid communication with a backside gas supply 160.

Here, the plurality of protrusions 148 comprise cylindrically shaped mesas having a mean diameter $D_1$ of between about 500 μm and about 5 mm, a center to center (CTC) spacing $D_2$ of between about 1 mm and about 40 mm, such as between about 5 mm and about 20 mm, and the height H (shown in FIG. 1A) of between about 3 m and about 700 μm, such as between about 3 μm and about 100 μm, such as between about 3 μm and about 50 μm, such as between about 3 μm and 20 μm, or more than about 3 μm. In other embodiments, the plurality of protrusions 148 comprise any other suitable shape such as square or rectangular blocks, cones, wedges, pyramids, posts, cylindrical mounds, or other protrusions of varying sizes, or combinations thereof that extend beyond the recessed surface 146 to support the substrate 132.

The one or more sealing bands 150a-b and the plurality of sealing lips 152 prevent, or significantly curtail, gas from flowing from the backside volume 156 between a substrate 132 and the substrate support 130 and into the processing volume 110 when the substrate 132 is chucked to the substrate support 130. The one or more sealing bands 150a-b include a first sealing band 150a and a second sealing band 150b. The first sealing band 150a is concentrically disposed about the center of the patterned surface 144 and proximate to an outer circumference thereof. The second sealing band 150b is concentrically disposed radially inward from the first sealing band 150a and proximate thereto. The one or more sealing bands 150a-b typically have a substantially rectangular cross-sectional profile, with the height H and a width between about 500 μm and about 5 mm.

Here, the plurality of sealing lips 152 comprise annular rings coaxially disposed about the center axis of respective lift pin openings 154 (shown in FIG. 1C) formed through the dielectric material of the substrate support 130. The plurality of sealing lips 152 typically have a substantially rectangular shaped cross sectional profile, across an inner diameter and an outer diameter of the annular ring, with the height H and a width between about 500 μm and about 5 mm.

In some embodiments, the substrate support 130 is a low contact surface area substrate support. For example, in some embodiments, the substrate contacting surfaces of the plurality of elevated features collectively comprise a contact surface area of less than about 30% of a non-device side surface area of a to be processed substrate disposed thereon. In some embodiments, the contact surface area is less than about 20%, such as less than about 15%, less than about 10%, less than about 5%, of for example less than about 3% of the non-device side surface area of a to be processed substrate.

Reducing the contact area between the non-device side surface of the substrate 132 and the patterned surface 144 has the desirable effect of reducing the area of the non-device side substrate surface exposed to conditions which can cause scratching, such as during chucking and de-chucking of the substrate 132 due to physical contact therebetween. However, reducing the contact area between the non-device side surface of the substrate 132 and the patterned surface 144 increases the contact force therebetween at the substrate contact surfaces thereof under the same, or substantially same, chucking force conditions. The increased contact force results in undesirable deeper scratches or pits in the non-device side surface of the substrate 132 and/or undesirable increased wear of the elevated features of the patterned surface 144 than a substrate support configured for higher contact area between the substrate 132 and the patterned surface 144. Often, substrate support to substrate support manufacturing variability or variations within the useful lifetime of a substrate support cause variations in the chucking force realized from a given chucking voltage. Therefore, in embodiments herein, the substrate support 130 further includes one or more sensors, such as the sensor 162, used to measure changes in the deflection of the substrate 132 when a chucking voltage is applied thereto. The sensor 162 may be any sensor suitable for detecting changes in the proximity of the non-device side surface of the substrate in relationship to the recessed surface 146 of the substrate support 130. In some embodiments, the sensor 162 is a fiber optic sensor, such as fiber optic intensity sensor comprising a plurality of optical fibers or a fiber optic interferometer comprising one or more optical fibers.

Here, the sensor 162 includes radiation source 164, a radiation detector 166, such as an intensity detector, a sensor terminal 168, and a fiber optic cable 172 coupling the radiation source 164 and the radiation detector 166 to the sensor terminal 168. In some embodiments the radiation source 164 provides infrared radiation having a wavelength between about 600 nm and about 1700 nm. Typically, the sensor terminal 168 is disposed in an opening 170 (shown in FIG. 1C) formed in the recessed surface 146 of the substrate support 130. In some embodiments, the opening 170 extends through the substrate support 130 and has a width W (shown in FIG. 1C) of between about 1 mm and about 10 mm. In some embodiments, the opening 170 is fluidly coupled to the backside gas supply 160 and the backside gas is delivered to the backside volume 156 therethrough.

Here, the fiber optic cable 172 includes one or more transmitting fibers 174 for transmitting radiation, e.g., light, from the radiation source 164 to the sensor terminal 168 and one or more receiving fibers 176 for transmitting radiation from the sensor terminal 168 to the radiation detector 166. In some embodiments, the substrate support 130 further includes a transparent insert 178, such as a quartz or sapphire window, (shown in FIG. 1B), disposed between the patterned surface 144 and the sensor 162. Here, the transparent insert is 178 is flush with or disposed below the recessed surface 146 of the substrate support 130. Typically, the sensor 162 is securely positioned in the walls of the opening 170 using one or more mounting members, such as a plurality of mounting springs 179 (shown in FIG. 1B). In some embodiments, the sensor terminal 168 further includes one or more transparent members 301 (shown in FIG. 3A-3B) positioned proximate to an end thereof. In some embodiments, the one or more transparent members 301 comprises one of, a plurality of, or a combination of an optical filter, such as a bandpass filter or a wavepass filter, e.g., a dichroic filter or dichroic mirror, a lens for dispersing and/or focusing radiation transmitted therethrough, or a waveplate or a retarder for changing the polarization state of light transmitted therethrough.

Here, the sensor 162 emits radiation from an end of the one or more transmitting fibers 174 disposed proximate to the patterned surface 144. The sensor 162 then measures a property of the radiation reflected by the non-device side surface of the substrate 132. Typically, the reflected radiation is received by end(s) of the one or more receiving fibers 176 disposed proximate to the patterned surface 144. The reflected radiation is then transmitted to the radiation detector 166 through the one or more receiving fibers 176 and the radiation detector 166 measures a property thereof. For example, in some embodiments the radiation detector 166 is configured to measure any one or a combination of the wavelength, phase, intensity, frequency, bandwidth, or an interference pattern of the radiation received thereinto. In some embodiments, the sensor 162 is a fiber optic intensity sensor configured to measure the intensity of radiation reflected by a substrate disposed on the substrate support. In other embodiments, the sensor 162 is an interferometer, such as a fiber optic interferometer or a self-mixing interferometer, disposed wholly or partially within the opening 170 formed in the substrate support 130.

Typically, the property or properties of the radiation reflected by the substrate 132, and measured by the radiation detector 166, are communicated to a system controller 180. The system controller 180 is used to adjust a chucking parameter, such as the chucking voltage, the gas pressure in the backside volume 156, or a combination thereof, to maintain a desired contact force between the substrate 132 and the elevated features of the patterned surface 144. A method for maintaining a desired contact force between the substrate 132 and the elevated features of the patterned surface 144 is set forth in FIG. 2.

In some embodiments, e.g., embodiments where the substrate support 130 features at least two electrodes 138$a$-$b$, the substrate support 130 comprises a plurality of sensors 162. In some of those embodiments the corresponding sensor terminals 168 of each sensor 162 are each positioned to measure a deflection of the substrate 132 towards a corresponding region of the recessed surface 146. In some of those embodiments, the system controller 180 may be used to independently adjust the chucking voltages provided to each of the chucking electrodes 138$a$-$b$.

Herein, the system controller 180 includes a programmable central processing unit (CPU) 182 that is operable with a memory 184 (e.g., non-volatile memory) and support circuits 186. The support circuits 186 are conventionally coupled to the CPU 182 and comprise cache, clock circuits, input/output subsystems, power supplies, and the like, and combinations thereof coupled to the various components of the processing chamber 100, to facilitate control thereof. The CPU 182 is one of any form of general purpose computer processor used in an industrial setting, such as a programmable logic controller (PLC), for controlling various components and sub-processors of the processing chamber 100. The memory 184, coupled to the CPU 182, is non-transitory and is typically one or more of readily available memories such as random access memory (RAM), read only memory (ROM), floppy disk drive, hard disk, or any other form of digital storage, local or remote.

Typically, the memory 184 is in the form of a computer-readable storage media containing instructions (e.g., non-volatile memory), that when executed by the CPU 182, facilitates the operation of the processing chamber 100. The instructions in the memory 184 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods described herein, or portions thereof, are performed by one or more application specific integrated circuits (ASICs), field-programmable gate arrays (FPGAs), or other types of hardware implementations. In some other embodiments, the processes described herein are performed by a combination of software routines, ASIC(s), FPGAs and, or, other types of hardware implementations. Herein, the system controller 180 is used to control the contact force between the non-device side surface of the substrate and the patter surface of the substrate support using the method set forth in FIG. 2.

Figure 2:
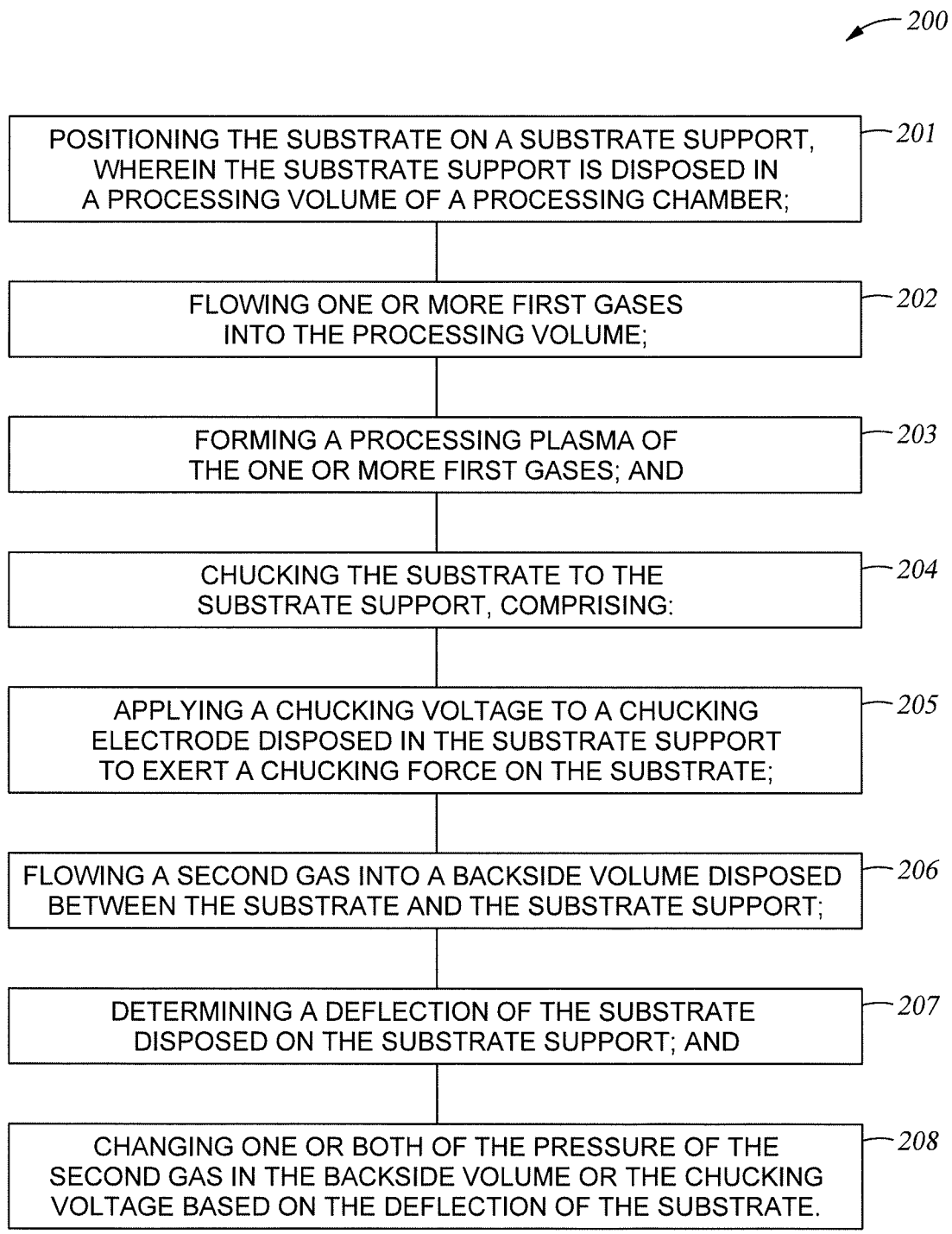
FIG. 2 is a flow diagram setting forth a method of processing a substrate, according to one embodiment.
Figure 3A:
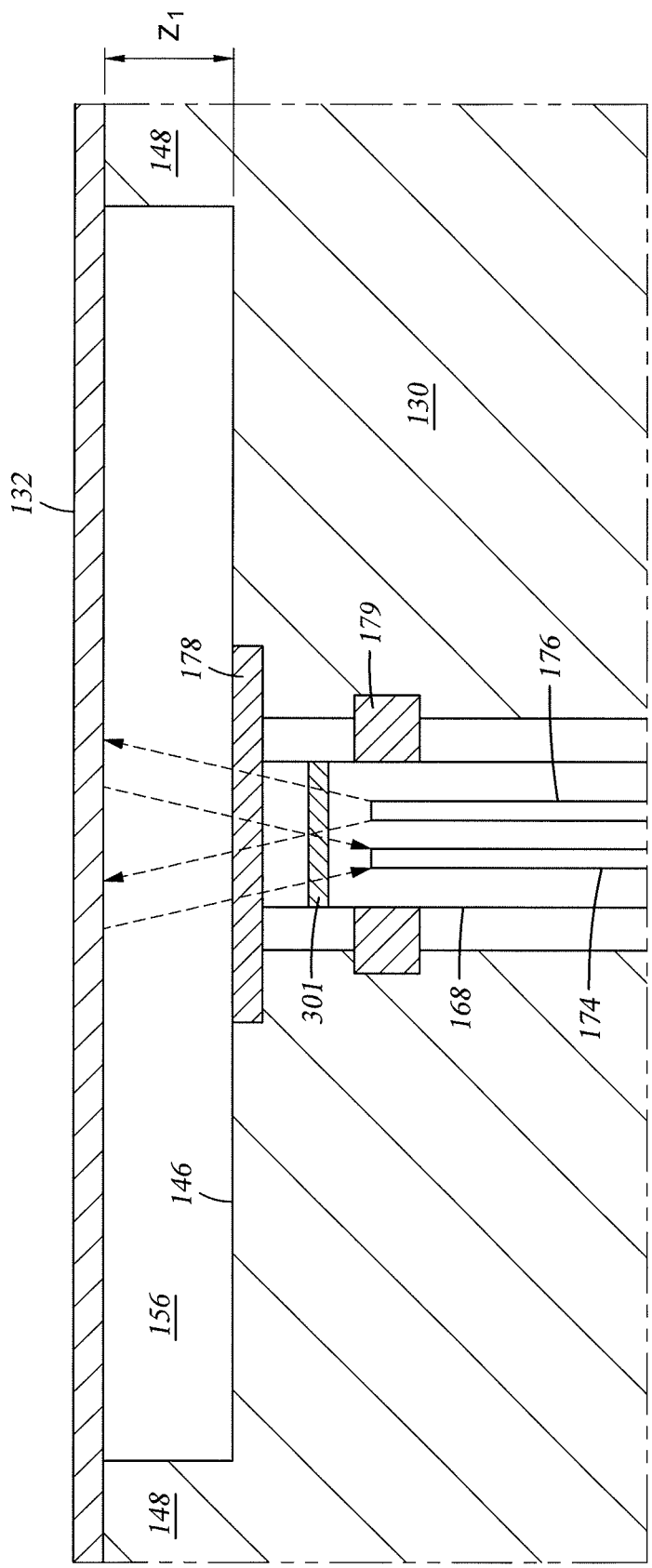
FIGS. 3A-3B illustrate elements of the method set forth in FIG. 2, according to one embodiment.
Figure 3B:
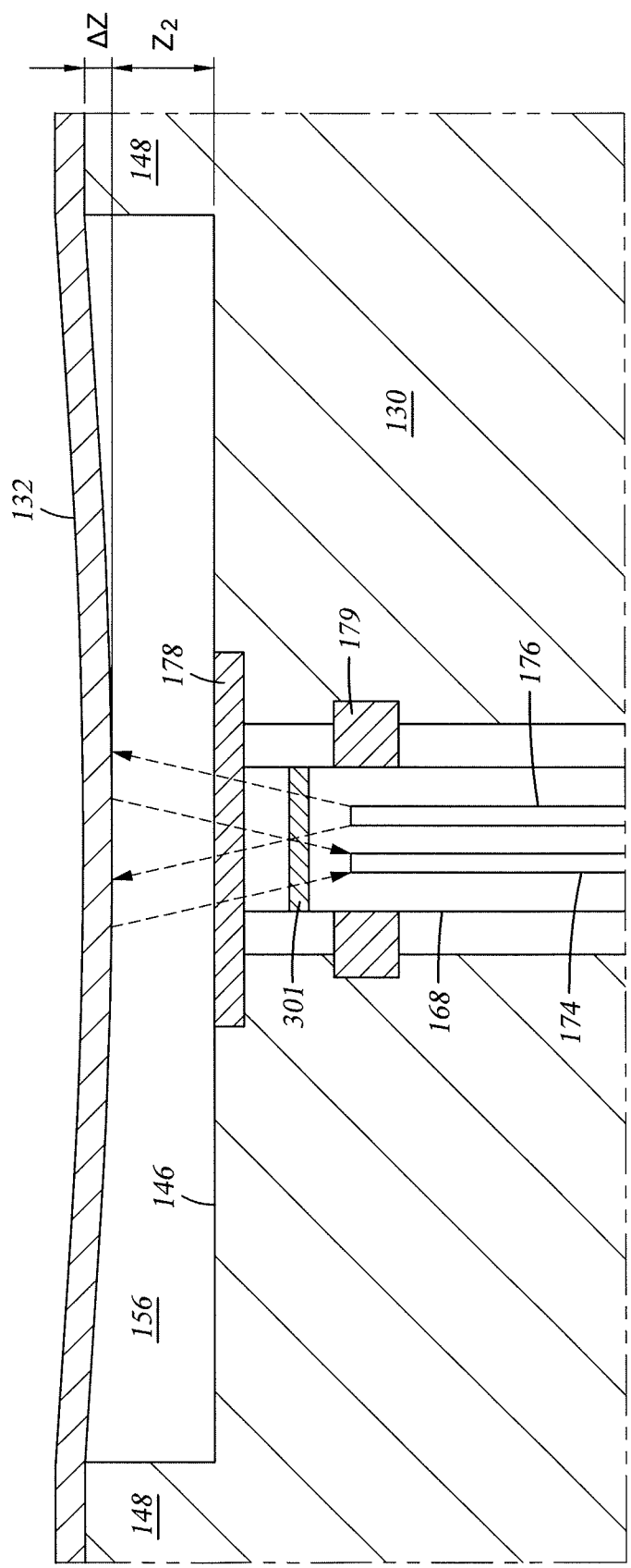

FIG. 2 is a flow diagram setting forth a method of processing a substrate, according to one embodiment. FIGS. 3A-3B illustrate elements of the method set forth in FIG. 2.

At activity 201 the method 200 includes positioning a substrate on a patterned surface of a substrate support. Here, the substrate support is disposed in a processing volume of a processing chamber, e.g., the substrate support and processing chamber described in FIG. 1A. At activities 202 and 203 the method 200 includes respectively flowing one or more processing gases into the processing volume and forming a processing plasma of the one or more processing gases. As shown in FIG. 3A, an unchucked substrate, here a substrate 132 positioned on the substrate support 130 before or after a chucking force is exerted on the substrate 132, has a substantially planer surface across a span between adjacent protrusions 148 so that an unchucked distance $Z_1$ between the recessed surface 146 and the non-device side surface of the substrate 132 is about the same as the height H (shown in FIG. 1A) of the protrusions 148 extending from the recessed surface.

Activities 204 and 205 comprise chucking the substrate to the substrate support. At activity 204 the method 200 includes applying a chucking voltage to a chucking electrode disposed in the substrate support to exert a chucking force on the substrate. At activity 205 the method 200 includes flowing a backside gas, typically a thermally conductive inert gas such as helium or argon, into a backside volume 156 disposed between the substrate 132 and the substrate support 130.

Herein, applying a chucking voltage to the chucking electrode pulls the substrate towards the recessed surfaces of the substrate support and the pressure of the gas in the backside volume pushes the substrate away from the recessed surface. To keep the substrate from moving on the substrate support, and in some embodiments, to fluidly isolate the backside volume from the processing volume, the chucking force per substrate area must exceed the gas pressure in the backside volume. This results in the substrate deflecting from an unchucked substrate plane (shown in FIG. 3A) by a deflection distance $\Delta Z$ (shown in FIG. 3B).

At activity 205 the method 200 includes monitoring the deflection $\Delta Z$ of the substrate 132 disposed on the substrate support 130. Typically, monitoring the deflection $\Delta Z$ of the substrate comprises measuring changes in a wavelength, phase, intensity, frequency, bandwidth, interference pattern, or a combination thereof of the radiation received by a sensor or a portion of a sensor, e.g., the sensor terminal 168, disposed in the substrate support 130, such as described in FIGS. 1A-1C.

At activity 206 the method 200 includes changing a chucking parameter based on the deflection $\Delta Z$ of the substrate 132. In some embodiments, changing a chucking parameter comprises changing the chucking voltage, changing the pressure of the second gas in the backside volume, simultaneously changing the chucking voltage and the pressure of the second gas in the backside volume, sequentially changing the chucking voltage and the pressure of the second gas in the backside volume, or a combination thereof. In some embodiments, changing a chucking parameter includes maintaining a difference between the chucking force per unit area of the non-device side surface of the substrate and the and the pressure of the gas in the backside volume at less than about 1 Torr or between about 0.25 Torr and about 1 Torr.

Embodiments described herein provide methods and apparatus used to reduce or substantially eliminate undesirable scratches to the non-active surface of a substrate by monitoring and controlling the deflection of a substrate, and thus the contact force between the substrate and a substrate support, during substrate processing.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. An apparatus for processing a substrate, the apparatus comprising a substrate support assembly, comprising:
    a substrate support comprising dielectric material having a sensor opening formed therethrough, wherein a surface of the dielectric material is patterned to form a recessed surface and a plurality of elevated features that extend upwardly from the recessed surface, and respective substrate-contact surfaces of the plurality of elevated features are substantially coplanar with one another; and
    a sensor comprising:
        a sensor terminal disposed in the sensor opening, the sensor terminal comprising a transparent member disposed on an end of the sensor terminal that is proximate to the recessed surface, wherein
            the sensor terminal is spaced apart from a wall of the sensor opening to define a gap therebetween,
            the sensor terminal is secured to the wall of the sensor opening using one or more mounting members, and
            the one or more mounting members are configured to allow a gas delivered to the sensor opening to flow around the sensor terminal towards the recessed surface;
        a radiation source;
        a radiation detector; and
        a plurality of optical fibers coupling the radiation source and radiation detector to the sensor terminal.

2. The apparatus of claim 1, wherein the sensor is configured to measure a wavelength, phase, intensity, frequency, bandwidth, interference pattern, or a combination thereof, of radiation reflected by a substrate disposed on the substrate support.

3. The apparatus of claim 1, further comprising a processing chamber, wherein the substrate support is disposed in a processing volume of the processing chamber.

4. The apparatus of claim 1, wherein the transparent member comprises a bandpass filter, wavepass filter, waveplate, a retarder, or a combination thereof.

5. The apparatus of claim 1, further comprising a computer readable medium having instructions stored thereon for a method of processing a substrate, the method comprising:
 (a) positioning the substrate on the substrate support, wherein the substrate has a support facing surface and the plurality of elevated features hold the support facing surface apart from the recessed surface of the substrate support to define a backside gas volume disposed therebetween;
 (b) applying a chucking voltage to a chucking electrode disposed in the dielectric material of the substrate support;
 (c) delivering, using a backside gas supply fluidly coupled to the sensor opening, a backside gas to the backside gas volume;
 (d) determining, by use of the sensor, a deflection of the substrate from a plane defined by the substrate-contact surfaces of the plurality of elevated features; and
 (e) changing one or more chucking parameters based on the deflection of the substrate determined at (d).

6. The apparatus of claim 1, wherein a plurality of gas ports are formed in the substrate support.

7. The apparatus of claim 1, wherein the elevated features comprise a plurality of protrusions, comprising:
 a mean diameter between 500 um and 5 mm;
 a center to center spacing of between about 1 mm and 40 mm; and
 a height of between about 3 um and about 700 um.

8. An apparatus for processing a substrate, comprising:
 a substrate support, comprising a dielectric material having a recessed surface, a plurality of protrusions that are spaced apart from one another, and one or more sealing bands concentrically disposed about a center of the recessed surface, wherein
 the plurality of protrusions and the one or more sealing bands extend upwardly from the recessed surface, and
 the plurality of protrusions and the one or more sealing bands each have a substrate contacting surface which collectively define a substrate supporting plane;
 a chucking electrode embedded in the dielectric material; and
 a sensor assembly comprising a sensor terminal disposed in an opening formed through the dielectric material of the substrate support, the sensor terminal comprising a transparent member disposed proximate to and recessed from the recessed surface; and,
 a computer readable medium having instructions stored thereon for a method of processing a substrate, the method comprising:
  positioning the substrate on the substrate support, wherein a support facing surface of the substrate, the recessed surface, and the one or more sealing bands collectively define a backside volume;
  applying a chucking voltage to the chucking electrode;
  delivering, using a gas supply fluidly coupled to the opening, a gas to the backside volume;
  determining, using the sensor assembly, a deflection of the substrate from the substrate supporting plane; and
  adjusting one or more chucking parameters based on the determined deflection of the substrate.

9. The apparatus of claim 8, wherein the support facing surface of the substrate has a first surface area, the collective substrate contacting surfaces of the substrate support have a second surface area, and the second surface area is less than about 30% of the first surface area.

10. The apparatus of claim 8, wherein the sensor assembly is configured to measure a wavelength, phase, intensity, frequency, bandwidth, interference pattern, or a combination thereof, of radiation reflected by the support facing surface of the substrate.

11. The apparatus of claim 8, wherein the sensor assembly further comprises a radiation source, a radiation detector, and a plurality of optical fibers, and wherein ends of the plurality of optical fibers are disposed in the sensor terminal proximate to the transparent member.

12. The apparatus of claim 8, wherein the transparent member comprises one or a combination of a bandpass filter, wavepass filter, waveplate, or a retarder.

13. The apparatus of claim 8, wherein a plurality of gas ports are formed in the substrate support.

14. The apparatus of claim 8, wherein the method further comprises:
 determining, based on the deflection of the substrate, a difference between a chucking pressure and a backside gas volume pressure, the chucking pressure comprising a chucking force per unit area of the substrate facing surface of the substrate; and
 adjusting one or more chucking parameters to maintain the difference between the chucking pressure and the backside gas volume pressure at about 1 Torr or less.

15. The apparatus of claim 8, wherein the plurality of protrusions comprise:
 a mean diameter between 500 um and 5 mm;
 a center to center spacing between adjacent protrusions of between about 1 mm and 40 mm; and
 a height of between about 3 um and about 700 um.

16. The apparatus of claim 8, wherein the plurality of protrusions comprise rectangular blocks, cones, wedges, pyramids, posts, cylindrical mounds, or combinations thereof that extend beyond the recessed surface to support the substrate.

17. The apparatus of claim 8, wherein the chucking electrode is one of a plurality of chucking electrodes, and the method further comprises independently applying respective chucking voltages to each of the plurality of chucking electrodes.

18. The apparatus of claim 9, wherein the second surface area is less than about 10% of the first surface area.

19. The apparatus of claim 5, wherein the method further comprises:
 (f) determining, based on the deflection of the substrate, a difference between a chucking pressure and a backside gas volume pressure, the chucking pressure comprising a chucking force per unit area of the substrate facing surface of the substrate; and
 (g) changing one or more chucking parameters to maintain the difference between the chucking pressure and the backside gas volume pressure at about 1 Torr or less.

20. A substrate support assembly sized to support a substrate having a first surface area, the substrate support assembly comprising:
 a substrate support comprising a dielectric material layer and a chucking electrode embedded in the dielectric material layer, the dielectric material layer having a recessed surface and plurality of protrusions and one or more sealing bands extending upwardly from the recessed surface, wherein
   the plurality or protrusions are spaced apart from one another and the one or more sealing bands are concentrically disposed about a center of the recessed surface, and
   upper surfaces of the plurality of protrusions and the one or more sealing bands are coplanar with one another to define a substrate supporting plane, the upper surfaces have a collective second surface area that is less than 10% of the first surface area,
a sensor assembly configured to determine a deflection of a substrate from the substrate supporting plane, comprising:
   a sensor terminal disposed in an opening formed through the dielectric material layer, the sensor terminal disposed proximate to the recessed surface; and
   a plurality of optical fibers, wherein
   ends of the plurality of optical fibers are disposed in the sensor terminal, and
   the sensor terminal is spaced apart from one sidewalls of the opening to allow a gas to flow therebetween.

* * * * *